(12) United States Patent
Chun et al.

(10) Patent No.: US 6,229,171 B1
(45) Date of Patent: May 8, 2001

(54) STORAGE ELEMENT FOR SEMICONDUCTOR CAPACITOR

(75) Inventors: Yoon-Soo Chun, Seoul; Yoo-Sang Hwang; Tae-Young Chung, both of Kyunggi-do, all of (KR)

(73) Assignee: Samsung Electronic Co., Ltd., Kyungki-do (KR)

( * ) Notice: Subject to any disclaimer, the term of this patent is extended or adjusted under 35 U.S.C. 154(b) by 0 days.

(21) Appl. No.: 09/347,823

(22) Filed: Jul. 2, 1999

(30) Foreign Application Priority Data

Jul. 3, 1998 (KR) .................................................. 98-26919

(51) Int. Cl.[7] ..................... H01L 21/8242; H01L 27/108; H01G 4/06
(52) U.S. Cl. .......................... 257/296; 257/306; 257/310; 438/253; 438/254; 438/396
(58) Field of Search .................................... 257/306, 310, 257/296; 438/253, 254, 396

(56) References Cited

U.S. PATENT DOCUMENTS 5,619,393 * 4/1997 Summerfelt et al. ............. 361/321.1
5,637,527 * 6/1997 Baek ..................................... 438/396
5,877,062 * 3/1999 Horii .................................... 438/396
5,994,197 * 11/1999 Liao ..................................... 438/396
6,046,469 * 4/2000 Yamazaki et al. .................... 257/306
6,084,765 * 7/2000 Lee ...................................... 361/311

* cited by examiner

Primary Examiner—Alexander O. Williams
(74) Attorney, Agent, or Firm—The Law Offices of Eugene M. Lee,PLLC

(57) ABSTRACT

A storage element of a stacked capacitor having a high dielectric film for a semiconductor device and a method of fabricating the same, the storage element having a storage node comprising a bottom polysilicon layer, a barrier metal layer, and a transition metal layer with sidewall spacers formed on the barrier metal layer. The barrier metal layer and sidewall spacers prevent the polysilicon layer from being oxidized. The polysilicon layer is formed to a thickness that determines the height of the storage node. The transition metal layer directly interfacing the high dielectric film is thinly formed to avoid slope etching thereof and thereby prevent electrical bridges or shorts between adjacent storage nodes.

13 Claims, 2 Drawing Sheets

STORAGE ELEMENT FOR SEMICONDUCTOR CAPACITOR

BACKGROUND OF THE INVENTION

1. Field of the Invention

The present invention relates to a semiconductor device and to a method for manufacturing the same and, more particularly, to a pillar type stacked storage node of a semiconductor capacity and a method for fabricating the same.

2. Description of the Related Art

As DRAM devices are scaled down to a line width of about a quarter micrometer, two-dimensional areas occupied by capacitors become smaller. On the other hand, since the capacitance of a capacitor must be maintained at a constant level, methods have been developed to maintain a desired capacitance from decreased two-dimensional areas.

One approach is to form a capacitor that has a three-dimensional structure by increasing the height of the capacitor so as to increase available cell surface areas. The increase in the height of the capacitor, however, causes a large step between the cell array region and the peripheral region, thus making it difficult to form metal interconnections.

An alternative approach is to increase the dielectric constant of the dielectric film of the capacitor. Recently, high dielectric materials such as strontium titanate ($SrTiO_3$), barium-strontium titanate (($Ba-Sr)TiO_3$), or the like having dielectric constant of more than 10,000, have been adopted for use as dielectric films. However, when polysilicon is used as a capacitor storage node, a layer of low dielectric characteristic is formed at the interface between the polysilicon layer and the high dielectric film, which thereby increases leakage current of the dielectric film.

Transition metals such as platinum (Pt) or the like are preferably used as a capacitor storage node when a high dielectric material, such as strontium titanate or barium-strontium titanate, is used as a dielectric film. However, there are also some problems when such transition metals are used in a high integrated circuit device. For example, in application, to about the range of 0.1 to 0.2 micrometers of spaced apart storage nodes, etched transition metal may be left deposited on sidewalls of the patterned storage nodes during a dry-etch process. As a result, an electrical bridge, i.e., a short, can arise between adjacent storage nodes.

A reference article, entitled "A Stacked Capacitor With An MOCVD ($Ba-Sr)TiO_3$ Film And A $RuO_2$/Ru Storage Node On A TiN-capped Plug For 4Gbit DRAMs And Beyond," by H. Yamaguchi et al, IEDM 1996-675 relates to stacked storage nodes. FIG. 1 is a cross-sectional view showing a stacked storage node according to the above-identified reference. The stacked storage node is fabricated by forming a contact hole 15 in an insulating layer 14 on a semiconductor substrate 10 by EB (electron beam) lithography and RIE (reactive ion etching). A phosphorous doped polysilicon layer 16, about 2000Å thick, is deposited in the contact hole 15 and on the insulating layer 14. The polysilicon layer 16 is then etched back to create a recess about 1000Å from the top surface of the insulating layer 14 in the contact hole 15. Titanium is then deposited and annealed by RTA in $N_2$ ambient to form a TiSix layer to reduce contact resistance. A 4000Å thick barrier metal layer 17, such as a titanium nitride layer, is then deposited and planarized to form a storage contact plug 18 by chemical mechanical polishing. As for the storage node, a thick transition metal layer 19, about 4500Å, (double layer of 500Å ruthenium and 4000Å ruthenium dioxide) is deposited by DC sputtering with a Ru metal target. Then the transition metal layer 19 is etched to form the storage node 20 with 0.15 micrometer spacings between nodes. A high dielectric film 21 is then deposited on the insulating layer 14 and the storage node 20.

However, there are some problems with the above mentioned method. For example, it is very difficult to etch the transition metal layer with about 0.15 micrometer spacings between the nodes. As mentioned above, etched transition metal can be redeposited on sidewalls of the storage nodes during dry etch. As a result, a storage node may have a sloped sidewall profile, thus forming an electrical bridge between adjacent storage nodes.

SUMMARY OF THE INVENTION

The present invention is directed to overcoming, or at least reducing, the effects of the problems set forth above. In accordance with one aspect of the invention there is provided a stacked capacitor node comprising a thick polysilicon layer, a barrier metal layer and a thin transition metal layer with a high capacitance and a good lateral profile.

In accordance with another aspect of the invention there is provided a method for fabricating a stacked capacitor node that provides a high capacitance and a good lateral profile without electrical bridges between adjacent storage nodes.

The present invention provides a stacked storage node with a bottom polysilicon layer, a barrier metal layer/sidewall spacers, and a transition metal layer/sidewall spacers with a substantially vertical sidewall profile. The barrier metal layer is made of a material selected from the group consisting of TiAlN, TiSiN, TaTiN, and TaAlN. The transition metal layer is made of a material selected from the group consisting of Pt, Ir, Ru, and the like. The barrier metal layer/sidewall spacers prevent reaction between the polysilicon and the transition metal. Also, the barrier metal layer/sidewall spacers prevent the reaction between the polysilicon layer and high dielectric film together with the transistor metal/sidewall spacers. The polysilicon layer is formed thick, for example, about 1000 Å to 6000 Å, in order to increase capacitance. The barrier metal layer is formed with a thickness enough to prevent reaction, e.g., a thickness of about 500 Å to 1000 Å. The transition metal is formed thin, e.g., about 450 Å to 500 Å, to avoid slope etching resulting from its thickness.

The structure of polysilicon/barrier metal/transition metal electrode of a storage node in accordance with the present invention is formed by forming a transistor on an active region of a semiconductor substrate. The active region is surrounded by an insulator, i.e., field oxide layer. An insulating layer is formed on the resulting structure. A contact hole is formed in the insulating layer to contact a desired active region. A conductive layer is deposited in the contact opening and on the insulating layer and then planarized to form a contact plug. A doped polysilicon layer is deposited on the contact plug and the insulating layer to a thickness of about 1000 Å to 6000 Å. A first barrier metal layer is then deposited on the polysilicon layer to protect the polysilicon layer during subsequent process in oxidation ambient to a thickness of about 500 Å to 1000 Å. A first transition metal layer is deposited thinly on the barrier metal layer to a thickness of about 450 Å to 500 Å. Selected portions of the first transition metal layer, the first barrier metal layer, and the polysilicon layer are sequentially etched to form a stacked storage node in contact with the contact plug.

To protect exposed sidewalls of the polysilicon layer, conductive spacers are formed on sidewalls of the stacked storage node. That is, a second barrier metal layer is deposited over the stacked storage node and then etched back to form barrier metal spacers on sidewalls of the stacked storage node. The barrier metal spacers prevent oxidation of the sidewall polysilicon. A second transition metal layer is then deposited on the barrier metal spacer and then etched back to form transition metal spacers on sidewalls of the stacked storage node. A high dielectric film is deposited on the insulating layer and the stacked storage node.

The transition metal is formed thin to avoid slope etching thereof. The available surface area of the storage nodes can be increased by adjusting the thickness of the polysilicon and barrier metal. Accordingly, high capacitance capacitors can be formed without micro bridges, i.e., electrical contacts, between adjacent storage nodes.

BRIEF DESCRIPTION OF THE DRAWINGS

These and other features of the present invention will be described with reference to the accompanying drawings, in which.

DESCRIPTION OF SPECIFIC EMBODIMENTS

Figure 1:
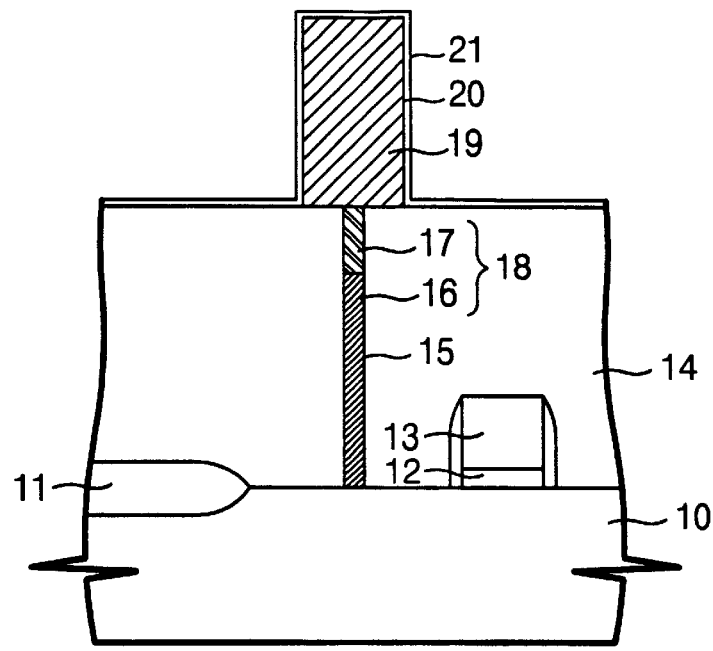
FIG. 1 is a cross-sectional view showing a stacked capacitor of a semiconductor device.

Korean application no. 98-26919 filed on Jul. 3, 1999, is hereby incorporated by reference as if fully set forth herein. In the drawings, the thickness of layers and regions are exaggerated for better understanding. It will also be understood that when a layer is referred to as being "on" another layer or substrate, it can be directly on the other layer or substrate, or intervening layers may also be present. In contrast, when an element is referred to as being "directly on" another element, there are no intervening elements present. Further, only one transistor and one capacitor are illustrated in the drawings for better understanding the present invention and for clarity of drawings.

The present invention is related to a stacked storage node of a semiconductor capacitor. Therefore, a process for forming the field oxide layer and the transistor structure as presently practiced in manufacturing DRAM cells are briefly described only in order to aid in the understanding of the present invention as it is well known by those of skill in the art.

Figure 2A:
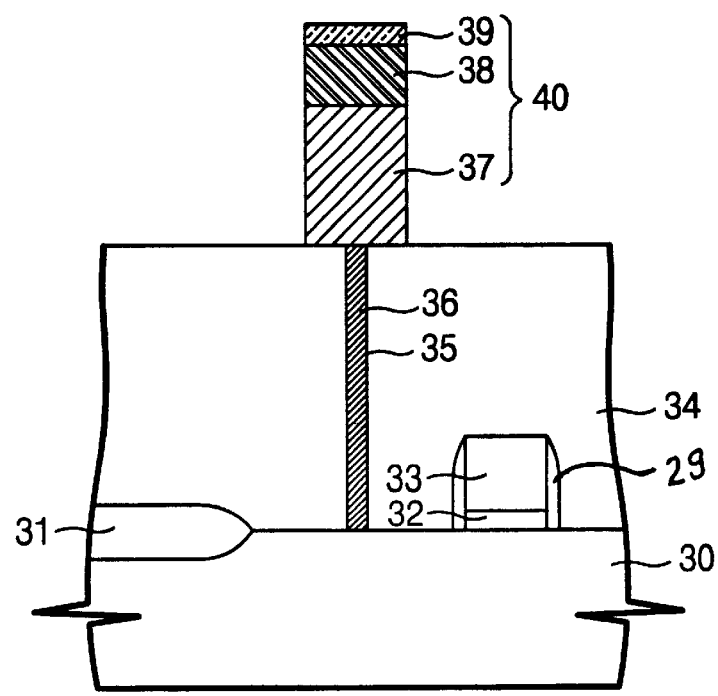
FIGS. 2A to 2C are cross-sectional views showing a method of fabricating a stacked capacitor of a semiconductor device according to the present invention.

Referring to FIG. 2A, a field oxide layer 31 is formed on a semiconductor substrate 30 to define an active region thereon. The field oxide layer 31 surrounds each active region. A transistor is formed on the active region. The transistor includes a gate oxide layer 32, a gate electrode 33, side wall spacers 29, and a pair of source/drain region (not shown). An insulating layer 34, for example, a BPSG (BoroPhosphoSilicate Glass) layer, a USG (Undoped Silicate Glass) layer, or the like, is formed on the semiconductor substrate 30 including the transistor.

A first photoresist is formed on the insulating layer 34 and then patterned into a desired configuration to define a storage contact region. Using the patterned photoresist layer, the insulating layer 34 is etched to form a contact hole 35, which reaches one of a source/drain region. A first conductive layer is deposited in the contact hole 35 and on the insulating layer 34 and then planarized down to the upper surface of the insulating layer 34 to form a contact plug 36. The first conductive layer is made of a material selected from the group consisting of polysilicon, tungsten, and aluminum.

A second conductive layer 37 is deposited on the insulating layer 34 and the contact plug 36. The second conductive layer 37 is preferably made of a polysilicon layer and has a thickness of about 1000 Å to 6000 Å. The thickness of the second conductive layer is dependant on the desired capacitance.

A barrier metal layer 38 is deposited on the second conductive layer 37 to a thickness of about 500 Å to 1000 Å. The barrier metal layer 38 is made of a material selected from the group consisting of TiAlN, TiSiN, TaTiN, and TaAlN. The barrier metal layer 38 serves as an oxidation barrier in a subsequent process. Oxygen can diffuse from a high dielectric film 43 (see FIG. 2C) into the polysilicon and thereby form a low dielectric characteristic layer such as a $SiO_2$ layer at the interface between the second conductive layer 37 and a high dielectric film 43.

A transition metal layer 39 is deposited on the barrier metal layer 38. The transition metal layer 39 is made of a material selected from the group consisting of platinum (Pt), iridium (Ir), and ruthenium (Ru). Since the transition metal layer 39 does not etch well, it must be deposited thinly, for example, to a thickness of about 450 Å to 500 Å, so as to avoid slope etching thereof.

A second photoresist layer (not shown) is deposited on the transition metal layer 39 and then patterned to a desired configuration to define a storage node region. Using the second patterned photoresist layer, the transition metal layer 39, the barrier metal layer 38 and the second conductive layer 37 are sequentially etched to form a storage node 40. Since the transition metal layer 39 is formed very thinly, slope etching thereof does not occur, and thus, a substantially vertical profile of the storage node 40 can be obtained.

Figure 2B:
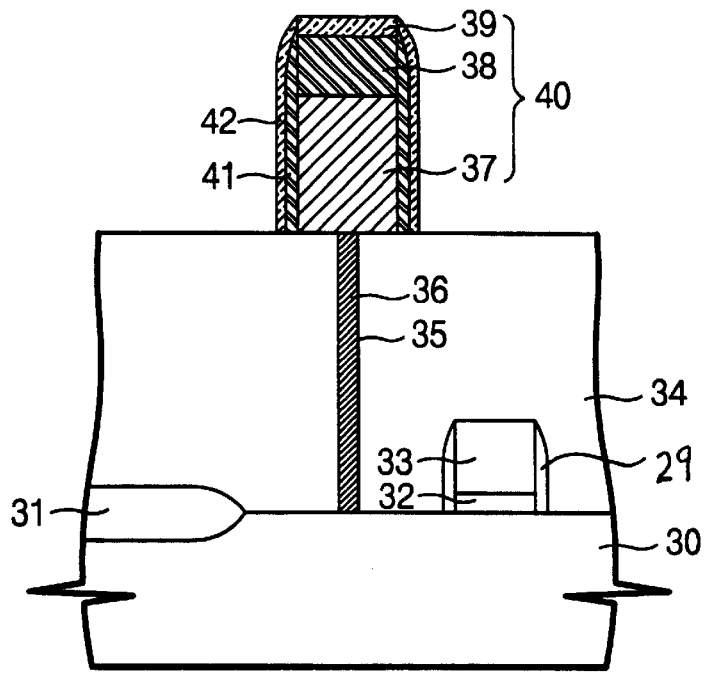

Formation of sidewall spacers is addressed next and is shown schematically in FIG. 2B. A second barrier metal is deposited on the insulating layer 34 and the storage node 40. An etch back process is performed to form barrier metal spacer 41 with a thickness of about 450 Å to 500 Å on sidewalls of the storage node 40. The second barrier metal layer is made of the same material as the first barrier layer 38. A second transition metal is deposited on the resulting structure. The second transition metal is then etched back to form transition metal spacer 42 having a thickness of about 450 Å to 500 Å on the barrier metal spacers 41. The barrier metal spacers 41 and the transition metal spacers 42 serve as an oxidation barrier.

Figure 2C:
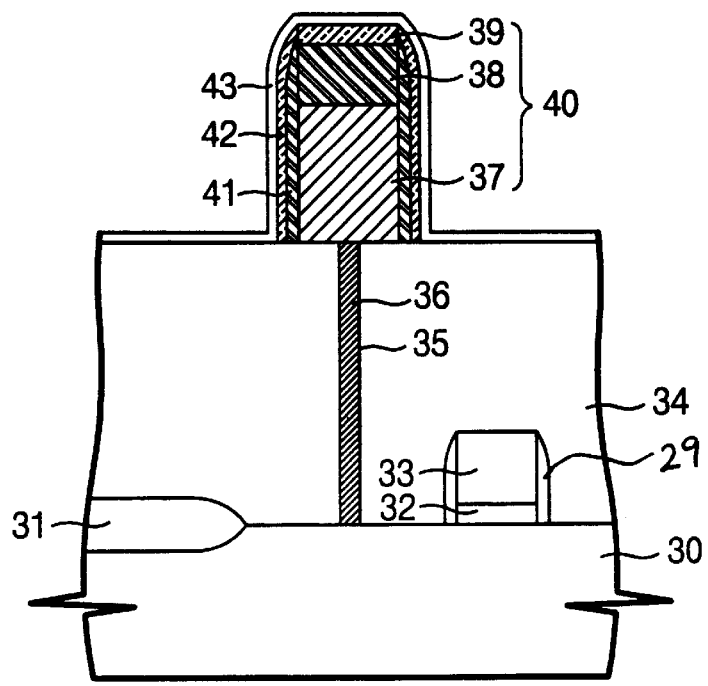

Referring now to FIG. 2C, a high dielectric film 43 is deposited on the insulating layer 34, the storage node 40, and the transition metal spacers 42. The high dielectric film 43 comprises $SrTiO_3$, or $(Ba-Sr)TiO_3$.

In a modified embodiment, the second conductive layer 37 can be formed to a thickness of about 500 Å to 1000 Å, and the first barrier metal layer 38 can be formed to a thickness of about 1000 Å to 6000 Å. In this case, a relatively smaller area of the sidewalls of the polysilicon layer is exposed, and thus, the process for forming the sidewall spacers can be somewhat relaxed.

The present invention provides a stacked storage node of a capacitor of a semiconductor device and a method of making same. The stacked storage node capacitor of the invention can be made with high capacitance and without micro bridges (i.e., electrical shorts) being formed between adjacent capacitors. Slope etching of the transition metal is prevented by forming thin layers thereof. The present invention allows for the formation of thick polysilicon layers and thick barrier metal layers which increases available surface area, thereby increasing capacitance.

Thus, a capacitor storage node of a semiconductor device and a method of fabricating the same have been described according to the present invention. While the invention is susceptible to various modifications and alternative forms, specific embodiments have been shown by way of example in the drawings and described in detail herein. However, it should be understood that the invention is not limited to the particular forms disclosed. Rather, the invention covers all modifications equivalents, and alternatives falling within the spirit and scope of the invention as defined in the appended claims.

What is claimed is:

1. A storage element of a stacked capacitor of a semiconductor device comprising:
   a contact plug formed in an insulating layer on a semiconductor substrate;
   a stacked storage node formed on the contact plug and on the insulating layer;
   a barrier metal spacer formed on sidewalls of the stacked storage node;
   a transition metal spacer formed on the barrier metal spacer; and
   a high dielectric film comprised of a material selected from the group consisting of $SrTiO_3$ and $(Ba,Sr)TiO_3$ formed on the insulating layer, the stacked storage node, and sidewalls of the transition metal spacer.

2. The storage element of claim 1, wherein the contact plug is formed of a material selected from the group consisting of polysilicon, tungsten, and aluminum.

3. The storage element of claim 1, wherein the stacked storage node comprises a conductive layer, a barrier metal layer formed on the conductive layer, and a transition metal layer formed on the barrier metal layer.

4. The storage element of claim 1, wherein the barrier metal spacer is made of a material selected from the group consisting of TiAlN, TiSiN, TaTiN and TaAlN.

5. The storage element of claim 1, wherein the barrier metal spacer has a thickness of about 450 Å to 500 Å.

6. The storage element of claim 1, wherein the transition metal spacer is made of a material selected from the group consisting of Pt, Ir, and Ru.

7. The storage element of claim 1, wherein the transition metal spacer has a thickness of about 450 Å to 500 Å.

8. The storage element of claim 3, wherein the conductive layer is formed of a polysilicon.

9. The storage element of claim 3, wherein the barrier metal layer is made of a material selected from a group consisting of TiAlN, TiSiN, TaTiN and TaAlN.

10. The storage element of claim 3, wherein the conductive layer has a thickness of about 1000 Å to 6000 Å, and the barrier metal layer has a thickness of about 500 Å to 1000 Å.

11. The storage element of claim 3, wherein the conductive layer has a thickness of about 500 Å to 1000 Å, and the barrier metal layer has a thickness of about 1000 Å to 6000 Å.

12. The storage element of claim 3, wherein the transition metal layer is made of a material selected from a group consisting of Pt, Ir, and Ru.

13. The storage element of claim 3, wherein the transition metal layer has a thickness of about 450 Å to 500 Å.

\* \* \* \* \*